(12) United States Patent
Matsuzawa

(10) Patent No.: US 12,395,147 B2
(45) Date of Patent: Aug. 19, 2025

(54) RESONATOR DEVICE AND METHOD FOR MANUFACTURING RESONATOR DEVICE

(71) Applicant: Seiko Epson Corporation, Tokyo (JP)

(72) Inventor: Yusuke Matsuzawa, Chino (JP)

(73) Assignee: SEIKO EPSON CORPORATION (JP)

( * ) Notice: Subject to any disclaimer, the term of this patent is extended or adjusted under 35 U.S.C. 154(b) by 879 days.

(21) Appl. No.: 17/583,489

(22) Filed: Jan. 25, 2022

(65) Prior Publication Data

US 2022/0239274 A1 Jul. 28, 2022

(30) Foreign Application Priority Data

Jan. 26, 2021 (JP) ................................. 2021-010083

(51) Int. Cl.
*H03H 9/05* (2006.01)
*H03H 3/02* (2006.01)
*H03H 9/10* (2006.01)
*H03H 9/19* (2006.01)

(52) U.S. Cl.
CPC ............ *H03H 9/0552* (2013.01); *H03H 3/02* (2013.01); *H03H 9/1021* (2013.01); *H03H 9/19* (2013.01); *H03H 2003/022* (2013.01)

(58) Field of Classification Search
CPC .. H03H 9/0552; H03H 9/0519; H03H 9/1021; H03H 9/0557; H03H 9/19; H03H 9/1014; H03H 9/02992; H03H 3/02; H03H 2003/022; H01L 2224/16225
See application file for complete search history.

(56) References Cited

U.S. PATENT DOCUMENTS

| | | | |
|---|---|---|---|
| 2005/0218491 A1* | 10/2005 | Sasaki | H05K 1/187 257/E23.174 |
| 2010/0243601 A1* | 9/2010 | Uematsu | H05K 3/427 216/20 |
| 2014/0084474 A1 | 3/2014 | Suhr et al. | |
| 2018/0376598 A1* | 12/2018 | Cho | H05K 3/321 |
| 2020/0058843 A1 | 2/2020 | Mizugaki | |

FOREIGN PATENT DOCUMENTS

| | | |
|---|---|---|
| JP | 2007-281289 A | 10/2007 |
| JP | 2014-519201 A | 8/2014 |
| JP | 2017-139717 A | 8/2017 |
| JP | 2020-028095 A | 2/2020 |

* cited by examiner

*Primary Examiner* — J. San Martin
(74) *Attorney, Agent, or Firm* — Harness, Dickey & Pierce, P.L.C.

(57) ABSTRACT

A resonator device includes a base and a resonator component disposed on the base. The base includes a semiconductor substrate having a first surface and a second surface that are in a front-to-back relation with each other; an integrated circuit that includes a wiring layer disposed at the second surface side and including a connection pad and includes an insulating layer disposed between the second surface and the wiring layer; a through electrode that penetrates the semiconductor substrate and the insulating layer and is coupled to the connection pad; and an annular metal layer that is disposed so as to penetrate the insulating layer between the second surface and the wiring layer and surrounds the through electrode in a plan view of the semiconductor substrate.

8 Claims, 12 Drawing Sheets

RESONATOR DEVICE AND METHOD FOR MANUFACTURING RESONATOR DEVICE

The present application is based on, and claims priority from JP Application Serial Number 2021-010083, filed Jan. 26, 2021, the disclosure of which is hereby incorporated by reference herein in its entirety.

BACKGROUND

1. Technical Field

The present disclosure relates to a resonator device and a method for manufacturing a resonator device.

2. Related Art

A semiconductor substrate described in JP-T-2014-519201 includes a silicon substrate, an insulating layer formed on the silicon substrate, a conductive pad formed on the insulating layer, and a through electrode penetrating the silicon substrate and the insulating layer and coupled to the conductive pad. A method for forming a through electrode includes forming a through hole in a silicon substrate by dry etching, forming a through hole in an insulating layer by wet etching, and filling the through holes with a metal material.

As described above, in the method for forming a through electrode in JP-T-2014-519201, the through hole is formed in the insulating layer by the wet etching. However, the wet etching is isotropic etching. Therefore, there is a problem that side etching occurs in the insulating layer, and the metal material enters a void unintentionally generated by the side etching, which may cause a pattern failure of a wiring (hereinafter, also referred to as "the wiring pattern failure due to the side etching").

SUMMARY

A resonator device according to the present disclosure includes: a base; and a resonator component disposed on the base, in which the base includes a semiconductor substrate having a first surface and a second surface that are in a front-to-back relation with each other; an integrated circuit that includes a wiring layer disposed at the second surface side and including a connection pad and includes an insulating layer disposed between the second surface and the wiring layer; a through electrode that penetrates the semiconductor substrate and the insulating layer and is coupled to the connection pad; and an annular metal layer that is disposed so as to penetrate the insulating layer between the second surface and the wiring layer, and surrounds the through electrode in a plan view of the semiconductor substrate.

A method for manufacturing a resonator device according to the present disclosure includes: a base preparation step of preparing a base that includes a semiconductor substrate having a first surface and a second surface that are in a front-to-back relation with each other, an integrated circuit that includes a wiring layer disposed at the second surface side and including a connection pad and includes an insulating layer disposed between the second surface and the wiring layer, and an annular metal layer that is disposed so as to penetrate the insulating layer between the second surface and the wiring layer; and a through electrode forming step of forming a through electrode penetrating the semiconductor substrate and the insulating layer and coupled to the connection pad through an inside of the metal layer, in which the through electrode forming step includes a through hole forming step of forming a through hole from the first surface to the connection pad through the inside of the metal layer by penetrating the semiconductor substrate by dry etching and then penetrating the insulating layer by wet etching; and a conductive material arranging step of disposing a conductive material in the through hole to form the through electrode.

DESCRIPTION OF EXEMPLARY EMBODIMENTS

Hereinafter, preferred embodiments of a resonator device are described with reference to the accompanying drawings. Further, for convenience of illustration, an upper side of a paper surface in FIGS. 1, 3, and 7 to 15 is also referred to as "upper", and a lower side of the paper surface is also referred to as "lower".

First Embodiment

Figure 1:
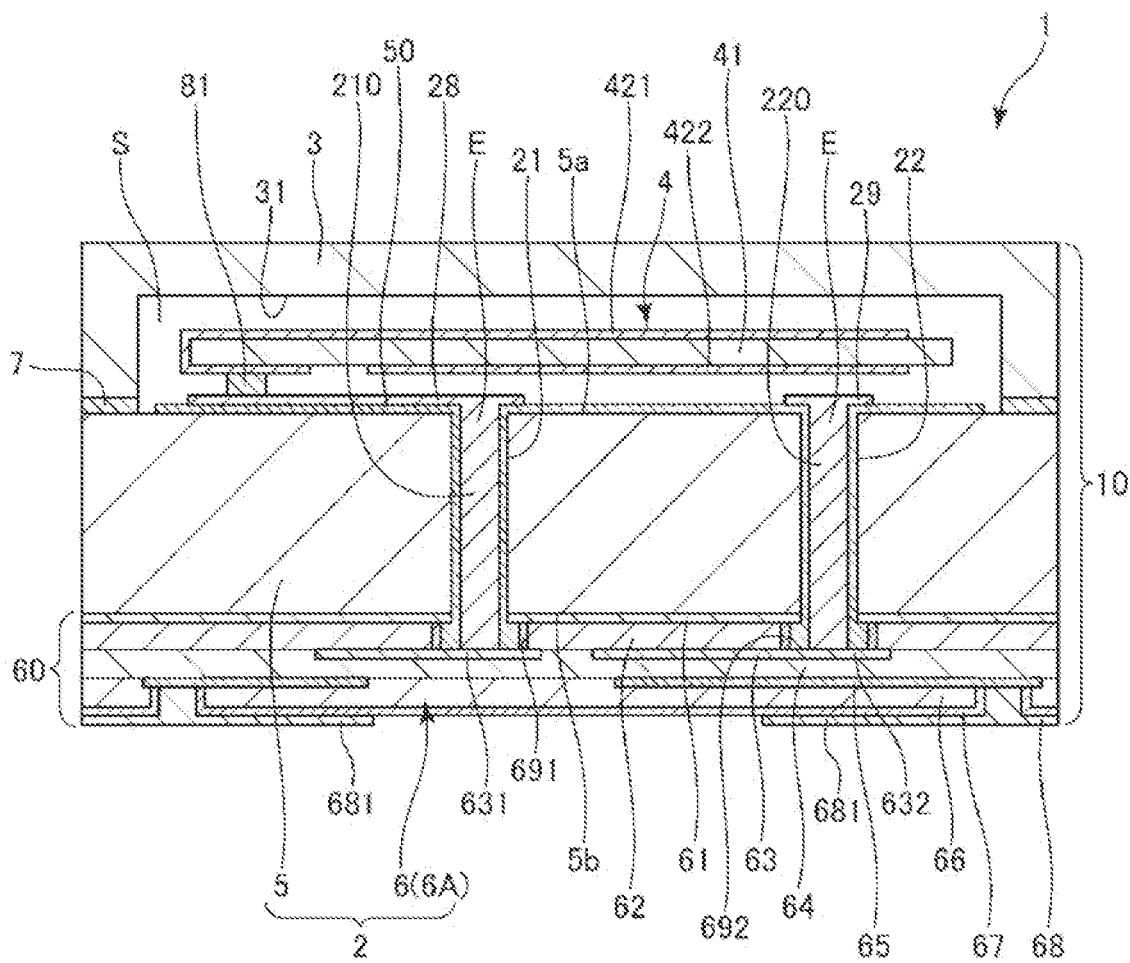
FIG. 1 is a vertical cross-sectional view illustrating a resonator device according to a first embodiment.
Figure 2:
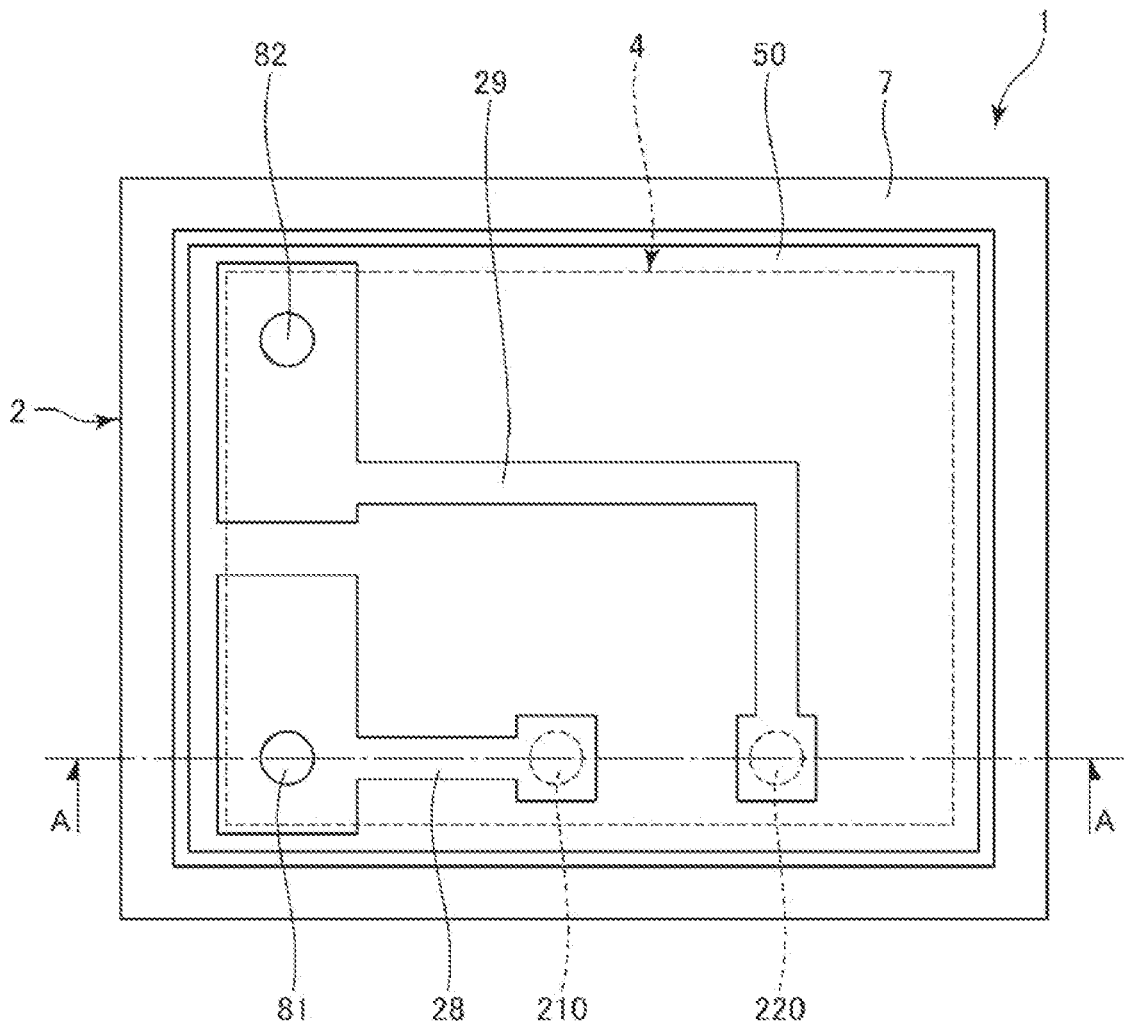
FIG. 2 is a plan view illustrating an upper surface of a base.
Figure 3:
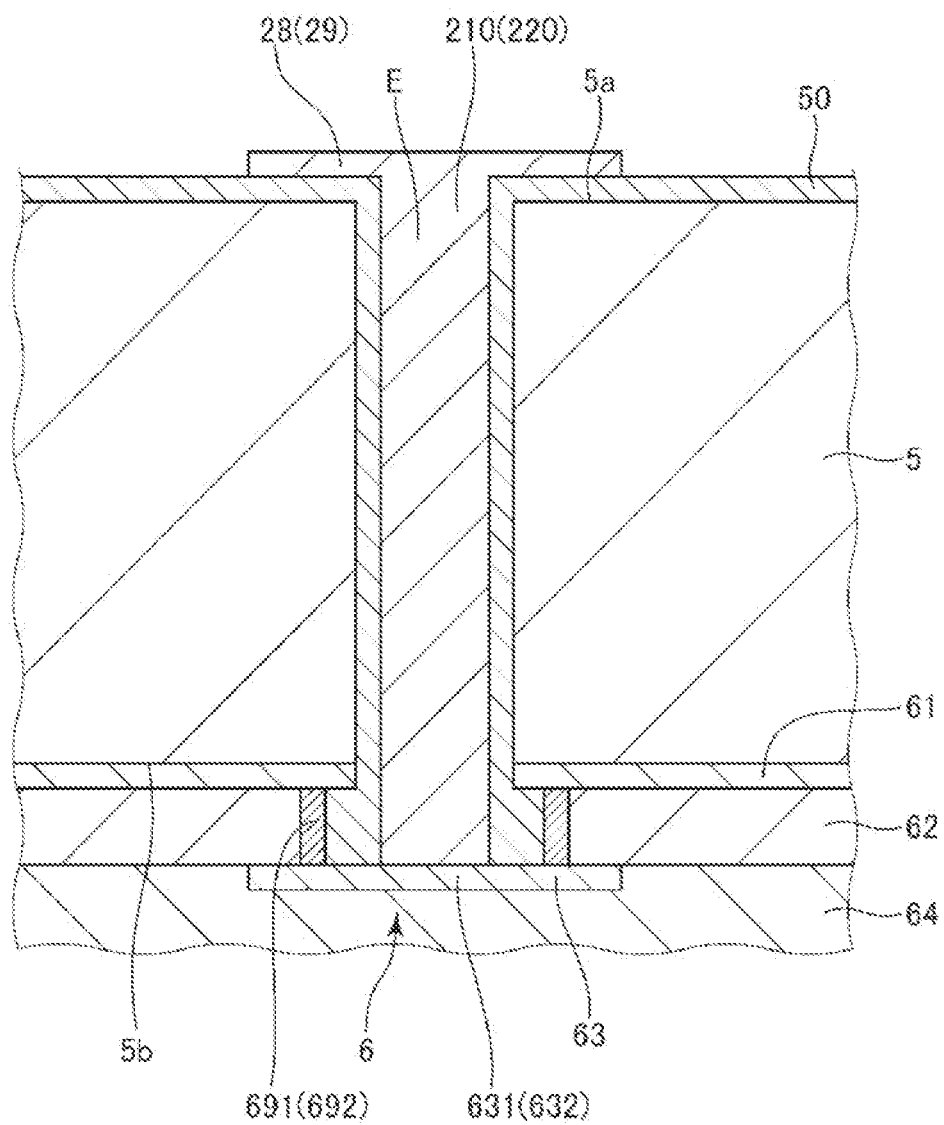
FIG. 3 is a vertical cross-sectional view illustrating a metal layer surrounding a through electrode.
Figure 4:
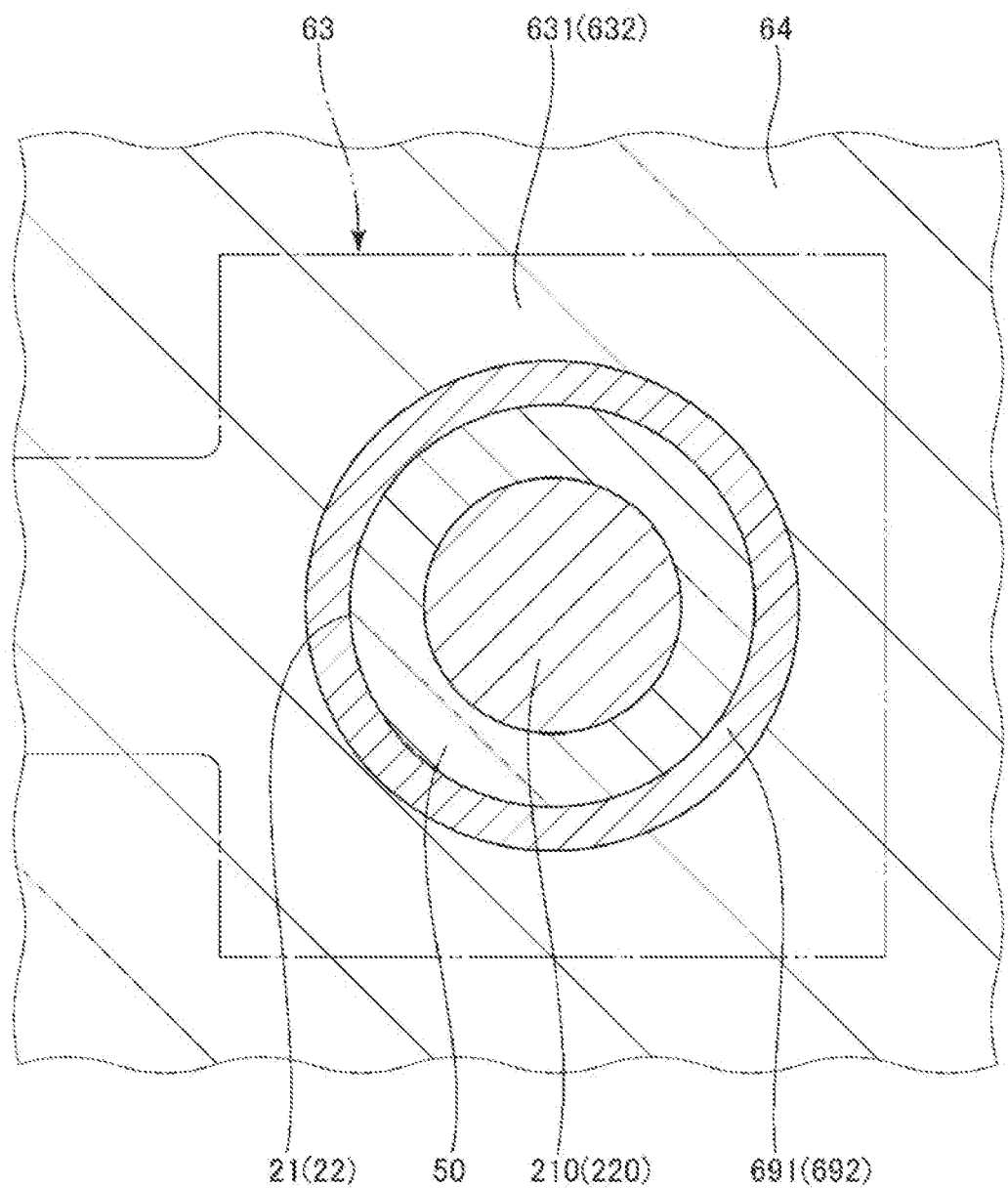
FIG. 4 is a horizontal cross-sectional view illustrating the metal layer surrounding the through electrode.
Figure 5:
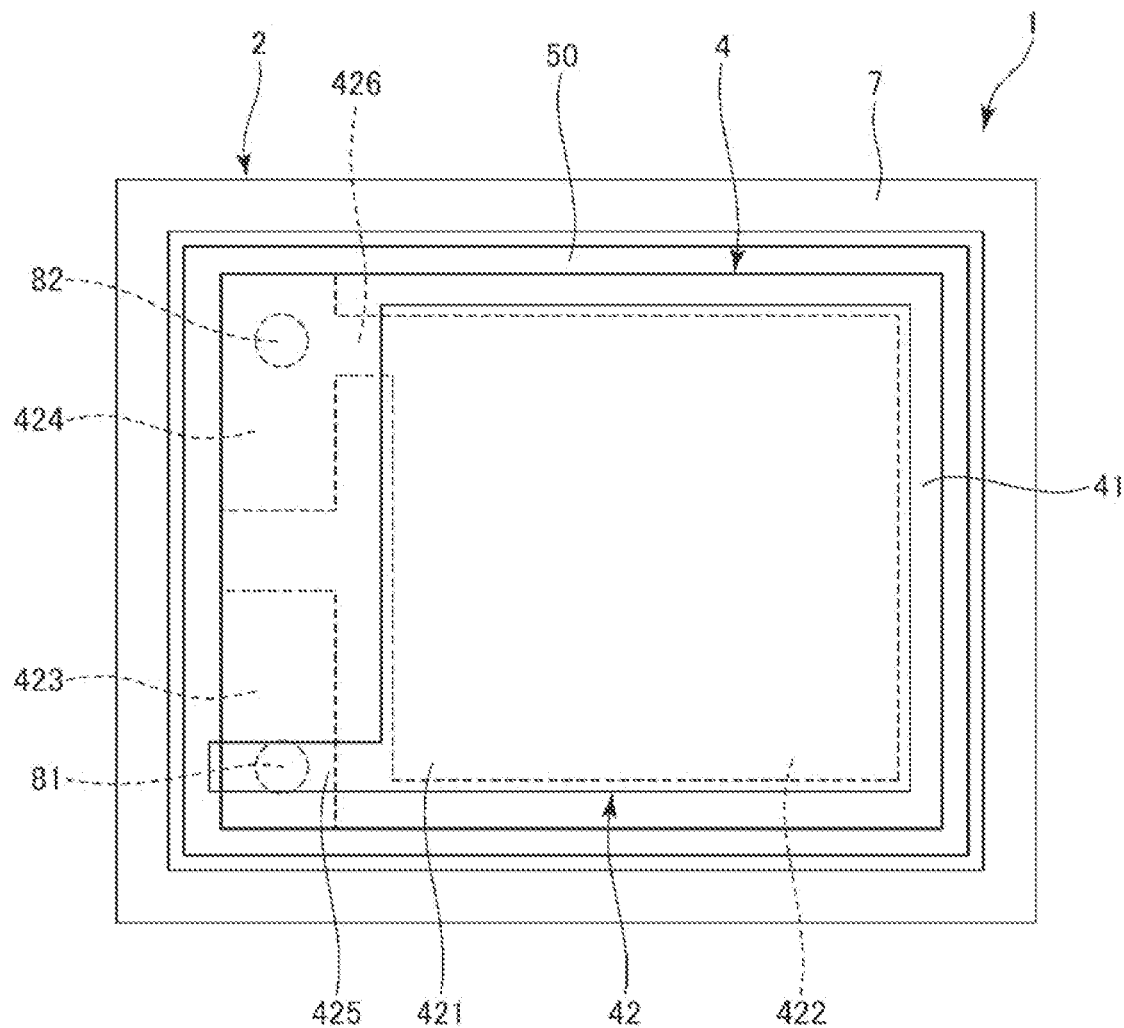
FIG. 5 is a plan view illustrating a resonator component.
Figure 6:
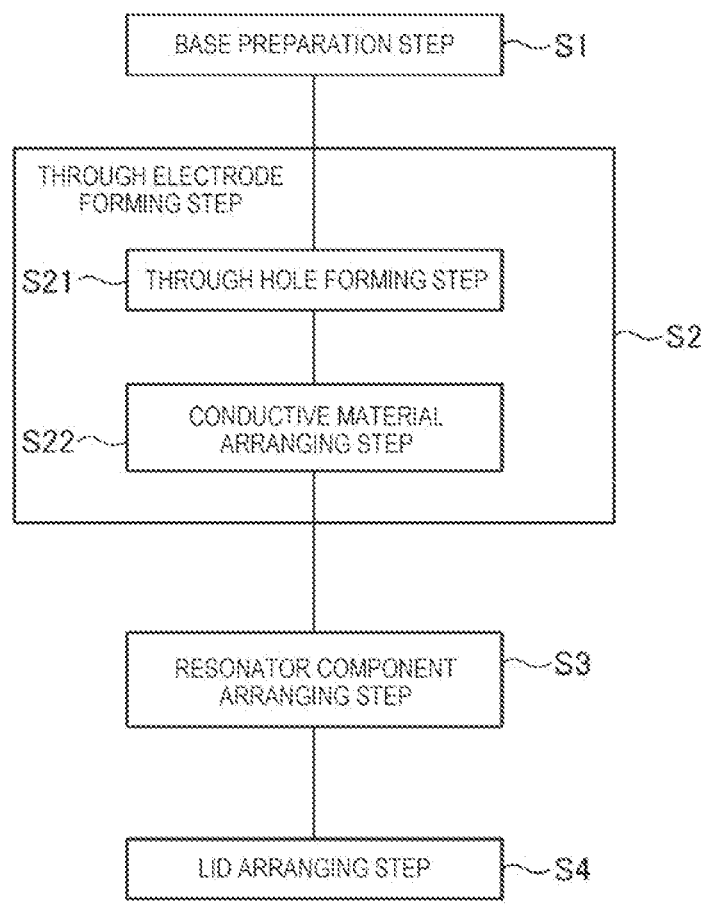
FIG. 6 is a flowchart illustrating manufacturing steps of a resonator device.

FIG. 1 is a vertical cross-sectional view illustrating a resonator device according to a first embodiment. FIG. 2 is a plan view illustrating an upper surface of a base. FIG. 3 is a vertical cross-sectional view illustrating a metal layer surrounding a through electrode. FIG. 4 is a horizontal cross-sectional view illustrating the metal layer surrounding the through electrode. FIG. 5 is a plan view illustrating a resonator component. FIG. 6 is a flowchart illustrating manufacturing steps of a resonator device. FIGS. 7 to 14 are vertical cross-sectional views illustrating a method for manufacturing the resonator device. FIG. 1 is a cross-sectional view taken along a line A-A in FIG. 2.

As illustrated in FIG. 1, a resonator device 1 includes a package 10 including an accommodating portion S, and a resonator component 4 accommodated in the accommodating portion S. The package 10 includes a base 2 on which the resonator component 4 is mounted, and a lid 3 covering the resonator component 4 and bonded to an upper surface of the base 2. The base 2 includes a semiconductor substrate 5 and an integrated circuit 6 disposed on the semiconductor substrate 5.

The semiconductor substrate 5 is a silicon substrate, in particular, a P-type silicon substrate. However, the semiconductor substrate 5 is not particularly limited, and may be an N-type silicon substrate. The semiconductor substrate 5 may be a semiconductor substrate other than the silicon substrate, for example, a Ge, GaP, GaAs, or InP semiconductor substrate.

The semiconductor substrate 5 is plate-shaped and has a first surface 5a and a second surface 5b that are in a front-to-back relation with each other. The first surface 5a is an upper surface, and the second surface 5b is a lower surface. An insulating film 50 made of silicon oxide ($SiO_2$) is formed on a surface of the semiconductor substrate 5. However, the insulating film 50 is not particularly limited, and may be, for example, an organic insulating film.

The integrated circuit 6 electrically coupled to the resonator component 4 is formed at a second surface 5b side of the semiconductor substrate 5. By forming the integrated circuit 6 at the semiconductor substrate 5, the semiconductor substrate 5 can be effectively utilized. In particular, by forming the integrated circuit 6 at the second surface 5b side, as compared with a case where the integrated circuit 6 is formed at a first surface 5a side, a wide space for forming the integrated circuit 6 can be secured since no bonding region with the lid 3 exists.

The integrated circuit 6 includes an oscillation circuit 6A that is electrically coupled to the resonator component 4 and generates an oscillation signal such as a clock signal by oscillating the resonator component 4. The integrated circuit 6 may include a circuit in addition to the oscillation circuit 6A. Examples of the circuit include a processing circuit that processes an output signal from the oscillation circuit 6A, and examples of such a processing circuit include a PLL circuit.

A stacked body 60 in which an etching stop layer 61, an insulating layer 62, a wiring layer 63, an insulating layer 64, a wiring layer 65, an insulating layer 66, a passivation film 67, and a terminal layer 68 are stacked in this order is formed at the second surface 5b side. A plurality of active components (not illustrated) formed at the second surface 5b side via the wiring layers 63 and 65 are electrically coupled to form the integrated circuit 6. The terminal layer 68 includes a plurality of mounting terminals 681. The integrated circuit 6 is electrically coupled to an external device via the mounting terminals 681. The number of the wiring layers provided in the stacked body 60 is not particularly limited, and may be one or three or more.

The base 2 is formed with a pair of through holes 21 and 22 that penetrate from the upper surface side of the base to the wiring layer 63 through the semiconductor substrate 5, the etching stop layer 61, and the insulating layer 62 in a thickness direction. As will be described in a method for manufacturing the resonator device 1 described later, the through holes 21 and 22 are formed by penetrating the semiconductor substrate 5 and the etching stop layer 61 by dry etching, and then penetrating the insulating layer 62 by wet etching. According to such a forming method, since the through holes 21 and 22 reach the wiring layer 63 during the wet etching, a plasma damage to the wiring layer 63 can be prevented. Since the semiconductor substrate 5 is penetrated by the dry etching, the through holes 21 and 22 having a high aspect ratio can be formed. Therefore, a reliability of the resonator device 1 can be improved and a size of the resonator device 1 can be reduced.

A conductive material E is filled in the through holes 21 and 22, and through electrodes 210 and 220 are formed. The through electrodes 210 and 220 are electrically coupled to connection pads 631 and 632 of the wiring layer 63, respectively. That is, the through electrodes 210 and 220 are coupled to the connection pads 631 and 632 included in the wiring layer 63, located closest to the semiconductor substrate 5, among the plurality of wiring layers 63 and 65 included in the integrated circuit 6. Accordingly, the through electrodes 210 and 220 can be shortened as compared with a case of coupling to connection pads included in the wiring layer 65. Therefore, the through electrodes 210 and 220 can be easily formed. However, the present disclosure is not limited thereto, and for example, the through electrodes 210 and 220 may be coupled to the connection pads included in the wiring layer 65.

As illustrated in FIG. 2, a pair of wirings 28 and 29 electrically coupled to the resonator component 4 via metal bumps 81 and 82 are disposed at the first surface 5a side of the semiconductor substrate 5. The wiring 28 is electrically coupled to the integrated circuit 6 via the through electrode 210, and the wiring 29 is electrically coupled to the integrated circuit 6 via the through electrode 220.

As illustrated in FIGS. 1 and 3, the base 2 is formed with metal layers 691 and 692 disposed between the etching stop layer 61 and the wiring layer 63 so as to penetrate the insulating layer 62. As illustrated in FIG. 4, each of the metal layers 691 and 692, in a plan view of the semiconductor substrate 5, has an annular shape surrounding the through electrodes 210 and 220. The wiring layer 63 is provided with the connection pads 631 and 632 coupled to the through electrodes 210 and 220, and in the plan view of the semiconductor substrate 5, the metal layer 691 is included in the connection pad 631, and the metal layer 692 is included in the connection pad 632. Therefore, upper ends of the metal layers 691 and 692 penetrate the insulating layer 62 and come into contact with a lower surface of the etching stop layer 61, and lower ends of the metal layers 691 and 692 penetrate the insulating layer 62 and come into contact with upper surfaces of the connection pads 631 and 632.

As will be described in the method for manufacturing the resonator device 1 described later, such metal layers 691 and 692 function as guard rings which are etching stop layers when forming the through holes 21 and 22. By providing the metal layers 691 and 692, when the through holes 21 and 22 are formed in the insulating layer 62 by the wet etching, side etching to an outside of the metal layers 691 and 692 is restricted, and further unintended side etching can be prevented. Therefore, the wiring pattern failure due to the side etching can be prevented, and the resonator device 1 has a high reliability.

The lid 3, similar to the semiconductor substrate 5, is a silicon substrate. Accordingly, linear expansion coefficients of the semiconductor substrate 5 and the lid 3 are equal. Therefore, generation of a thermal stress due to thermal expansion is prevented, and the resonator device 1 has excellent resonating characteristics. In addition, since the resonator device 1 can be formed by a semiconductor process, the resonator device 1 can be manufactured with a high accuracy, and the size of the resonator device 1 can be reduced. However, the lid 3 is not particularly limited, and may use a semiconductor substrate other than silicon substrate, for example, a Ge, GaP, GaAs, or InP semiconductor substrate. For example, a substrate other than a metal substrate such as a kovar substrate, or a semiconductor substrate such as a glass substrate may be used.

As illustrated in FIG. 1, the lid 3 includes a bottomed recess 31 that opens in a lower surface of the lid 3 and accommodates the resonator component 4 therein. The lower surface of the lid 3 is bonded to the upper surface of the base 2 via a bonding member 7. Accordingly, the accommodating portion S, which is a space accommodating the resonator component 4, is formed between the lid 3 and the base 2. In the present embodiment, the lid 3 and the base 2 are bonded by using diffusion bonding utilizing diffusion between metals. However, a bonding method between the lid 3 and the base 2 is not particularly limited.

The accommodating portion S is airtight and in a reduced pressure state, preferably in a state close to a vacuum. Accordingly, viscous resistance is reduced, and oscillation characteristics of the resonator component 4 are improved. However, an atmosphere of the accommodating portion S is not particularly limited, and may be, for example, an atmosphere in which an inert gas such as nitrogen or Ar is sealed, or may be in an atmospheric pressure state or a pressurized state instead of the reduced pressure state.

As illustrated in FIG. 5, the resonator component 4 includes a resonator substrate 41 and an electrode 42 disposed on a surface of the resonator substrate 41. The resonator substrate 41 includes a thickness-shear resonation mode, and is formed by an AT-cut quartz crystal substrate in the present embodiment. Since the AT-cut quartz crystal substrate has cubic frequency-temperature characteristics, the AT-cut quartz crystal substrate is the resonator component 4 having excellent temperature characteristics. The electrode 42 includes an excitation electrode 421 disposed on an upper surface of the resonator substrate 41 and an excitation electrode 422 disposed on a lower surface so as to face the excitation electrode 421. The electrode 42 includes a pair of terminals 423 and 424 disposed on the lower surface of the resonator substrate 41, a wiring 425 that electrically couples the terminal 423 to the excitation electrode 421, and a wiring 426 that electrically couples the terminal 424 to the excitation electrode 422.

A configuration of the resonator component 4 is not limited to the above configuration. For example, the resonator component 4 may be a mesa shape in which a resonation region sandwiched between the excitation electrodes 421 and 422 protrudes from a periphery of the resonation region, or conversely, may be an inverted mesa shape in which the resonation region is recessed from the periphery of the resonation region. Bevel processing for grinding a periphery of the resonator substrate 41 and convex processing in which the upper surface and the lower surface are made as convex curve surfaces may be performed.

The resonator component 4 is not limited to one that resonates in the thickness-shear resonation mode, and for example, may be one in which a plurality of resonating arms are bent and resonate in an in-plane direction like a tuning fork type resonator component. That is, the resonator substrate 41 is not limited to one formed by the AT-cut quartz crystal substrate, and may be formed by a quartz crystal substrate other than the AT-cut quartz crystal substrate, for example, an X-cut quartz crystal substrate, a Y-cut quartz crystal substrate, a Z-cut quartz crystal substrate, a BT-cut quartz crystal substrate, an SC-cut quartz crystal substrate, and an ST-cut quartz crystal substrate.

A constituent material of the resonator substrate 41 is not limited to a quartz crystal, and may be formed by, for example, a lithium niobate, lithium tantalate, lithium tetraborate, langasite, potassium niobate, or gallium phosphate monocrystalline piezoelectric body, or may be formed by other monocrystalline piezoelectric bodies. Further, the resonator component 4 is not limited to a piezoelectric driven type resonator element, and may be an electrostatically driven type resonator element using an electrostatic force.

Such a resonator component 4 is located at the first surface 5a side of the semiconductor substrate 5. The resonator component 4 is bonded to the base 2 by the pair of metal bumps 81 and 82, and is electrically coupled to the wirings 28 and 29. The metal bumps 81 and 82 are stud bumps, plated bumps, or the like. The method for coupling the resonator component 4 to the base 2 is not particularly limited, and for example, the resonator component 4 may be bonded to the base 2 by a conductive adhesive and may be electrically coupled to the wirings 28 and 29.

A configuration of the resonator device 1 is described above. Next, a method for manufacturing the resonator device 1 will be described. The method for manufacturing the resonator device 1, as illustrated in FIG. 6, includes a base preparation step S1, a through electrode forming step S2, a resonator component arranging step S3, and a lid arranging step S4. The through electrode forming step S2 includes a through hole forming step S21 and a conductive material arranging step S22.

Base Preparation Step S1

Figure 7:
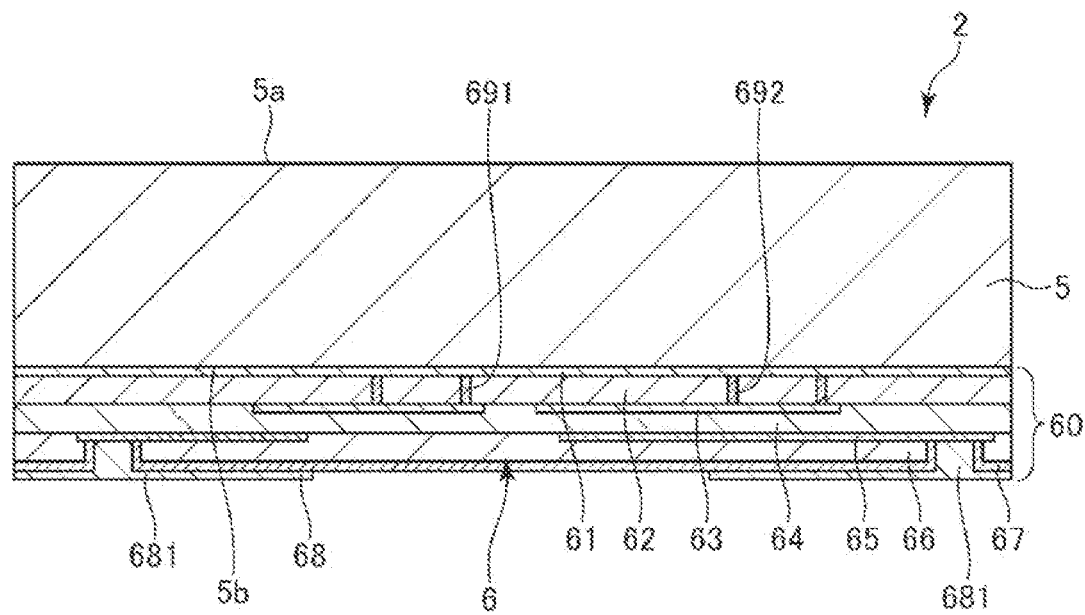
FIG. 7 is a vertical cross-sectional view illustrating a method for manufacturing a resonator device.

First, as illustrated in FIG. 7, the base 2 is prepared. At this stage, the through electrodes 210 and 220 and the wirings 28 and 29 are not formed at the base 2. That is, the base 2 includes the semiconductor substrate 5, the integrated circuit 6 provided at the second surface 5b side of the semiconductor substrate 5, and the annular metal layers 691 and 692 formed in the integrated circuit 6. The etching stop layer 61 is made of silicon nitride (SiN), and the insulating layers 62 and 64 are made of silicon oxide (SiO$_2$). The wiring layers 63 and 65, the terminal layer 68, and the metal layers 691 and 692 are each made of aluminum (Al), and the passivation film 67 is made of polyimide. However, the constituent materials of the respective layers are not particularly limited as long as the layers can exhibit their functions.

Through Electrode Forming Step S2

Through Hole Forming Step S21

Figure 8:
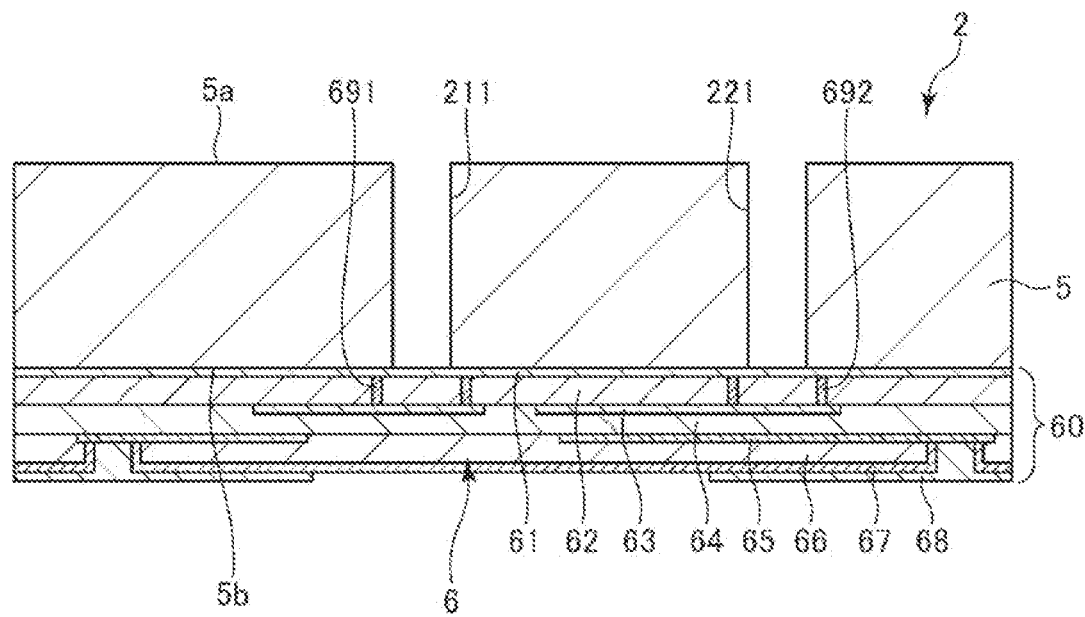
FIG. 8 is a vertical cross-sectional view illustrating the method for manufacturing the resonator device.

Next, as illustrated in FIG. 8, the through holes 211 and 221 that penetrate the semiconductor substrate 5 in the thickness direction are formed. The through holes 211 and 221 are formed by the dry etching, especially by a Bosch method. Accordingly, the through holes 211 and 221 having a high aspect ratio can be formed. The etching stop layer 61 functions as a stop layer for the dry etching. In particular, by forming the etching stop layer 61 with SiN (silicon nitride), the etching stop layer 61 has a high selectivity for the dry etching, and over-etching can be effectively prevented. Therefore, for example, the through holes 211 and 221 can be effectively prevented from reaching the wiring layer 63 and causing the plasma damage to the wiring layer 63. As a result, the wiring pattern failure due to the dry etching can be prevented, and the resonator device 1 having a high reliability can be manufactured.

Figure 9:
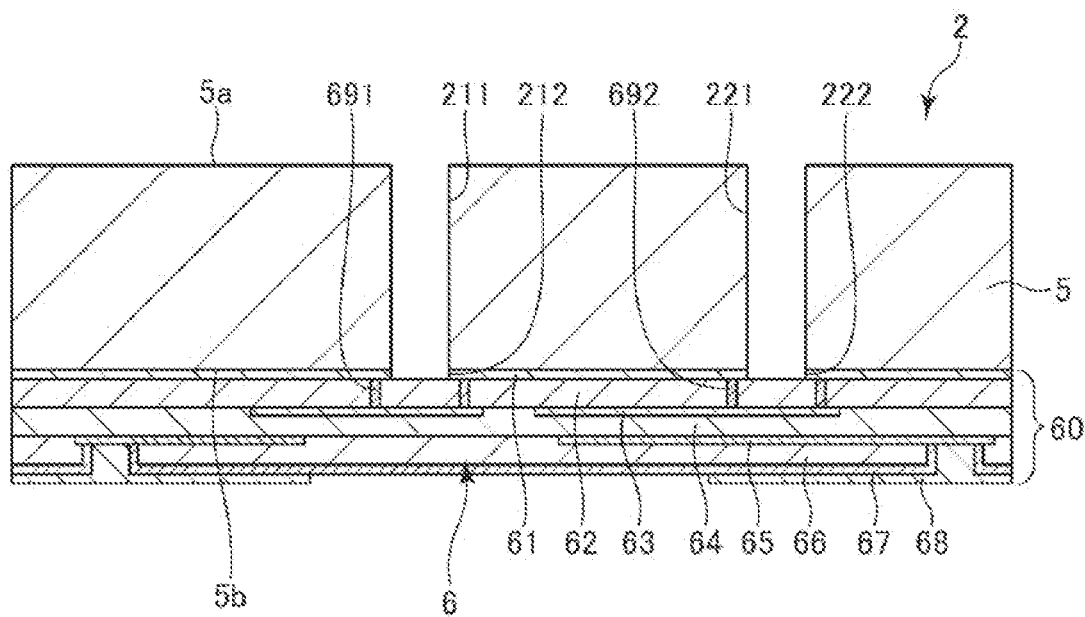
FIG. 9 is a vertical cross-sectional view illustrating the method for manufacturing the resonator device.

Next, as illustrated in FIG. 9, digging is performed from lower ends of the through holes 211 and 221 to form through holes 212 and 222 that penetrate the etching stop layer 61 in the thickness direction. The through holes 212 and 222 are formed by the dry etching. However, the present disclosure is not limited thereto, and the through holes 212 and 222 may be formed by the wet etching.

Figure 10:
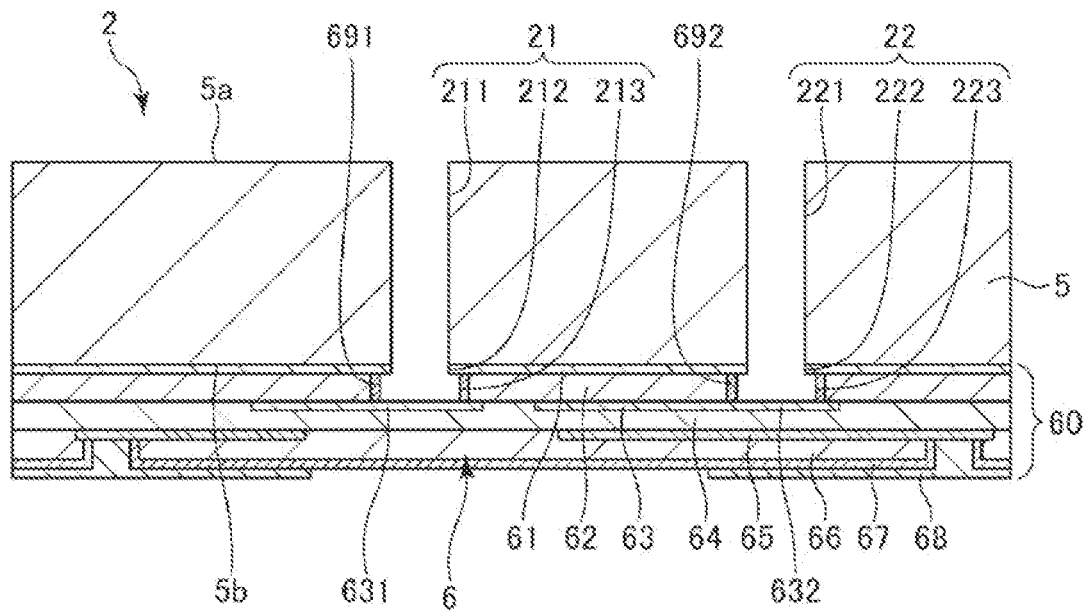
FIG. 10 is a vertical cross-sectional view illustrating the method for manufacturing the resonator device.

Next, as illustrated in FIG. 10, digging is performed from lower ends of the through hole 212 and 222 to form through holes 213 and 223 that pass through an inside of the metal layers 691 and 692 and penetrate the insulating layer 62 in the thickness direction. The through holes 213 and 223 are formed by the wet etching. By forming the through holes 213 and 223 by the wet etching, the plasma damage to the wiring layer 63 as in a case of forming the through holes 213 and 223 by the dry etching does not occur. Therefore, the wiring pattern failure due to the dry etching can be prevented. Instead, in the wet etching, the side etching may occur, resulting in the wiring pattern failure due to the wet etching. However, in the present embodiment, since the through holes 213 and 223 pass through the inside of the metal layers 691 and 692, the metal layers 691 and 692 further restrict the side etching to the outside. Therefore, the unintended side etching is prevented. As a result, the wiring pattern failure due to the side etching is prevented, and the resonator device 1 having a high reliability can be manufactured.

In particular, in the present embodiment, in the plan view of the semiconductor substrate 5, the metal layers 691 and 692 are included in the connection pads 631 and 632, and the lower ends of the metal layers 691 and 692 come into contact with the upper surfaces of the connection pads 631 and 632. Therefore, entering of an etching solution to the outside of the metal layers 691 and 692 can be effectively prevented, and the unintended side etching can be effectively prevented. As a result, the wiring pattern failure due to the wet etching can be more effectively prevented.

By the above steps, the through holes 21 and 22 are formed from the first surface 5a through the inside of the metal layers 691 and 692 to the connection pads 631 and 632 of the wiring layer 63. According to the method for forming the through holes 21 and 22 as described above, the plasma damage to the wiring layer 63 and the wiring pattern failure due to the side etching can be prevented, and the through holes 21 and 22 having a high aspect ratio can be formed. Therefore, the highly reliable and compact resonator device 1 can be manufactured.

Conductive Material Arranging Step S22

Figure 11:
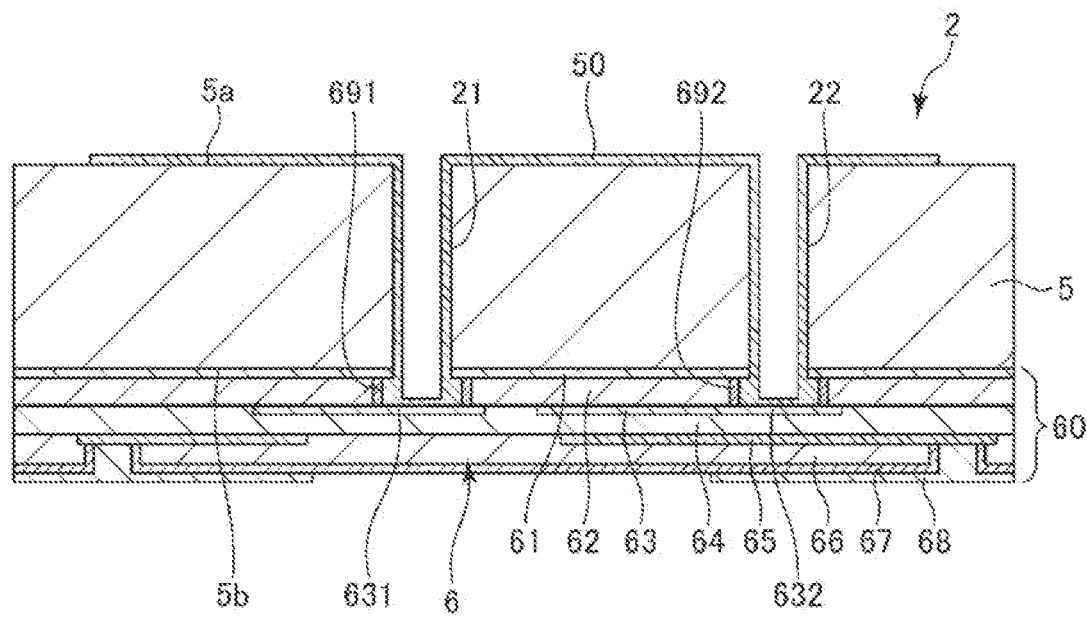
FIG. 11 is a vertical cross-sectional view illustrating the method for manufacturing the resonator device.
Figure 12:
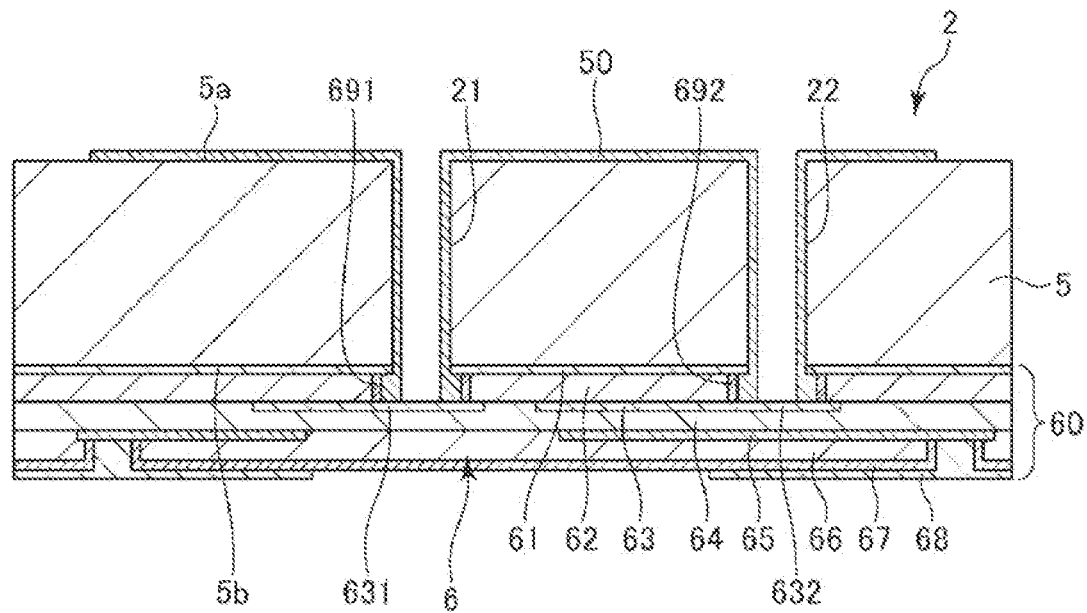
FIG. 12 is a vertical cross-sectional view illustrating the method for manufacturing the resonator device.

Next, as illustrated in FIG. 11, the insulating film is formed on the first surface 5a of the semiconductor substrate 5 and inner surfaces of the through holes 21 and 22. The method for forming the insulating film 50 is not particularly limited, and for example, chemical vapor deposition (CVD) can be used. Next, as illustrated in FIG. 12, the insulating film 50 formed on bottom surfaces of the through holes 21 and 22 is removed by etching to expose the connection pads 631 and 632 in the through holes 21 and 22.

Figure 13:
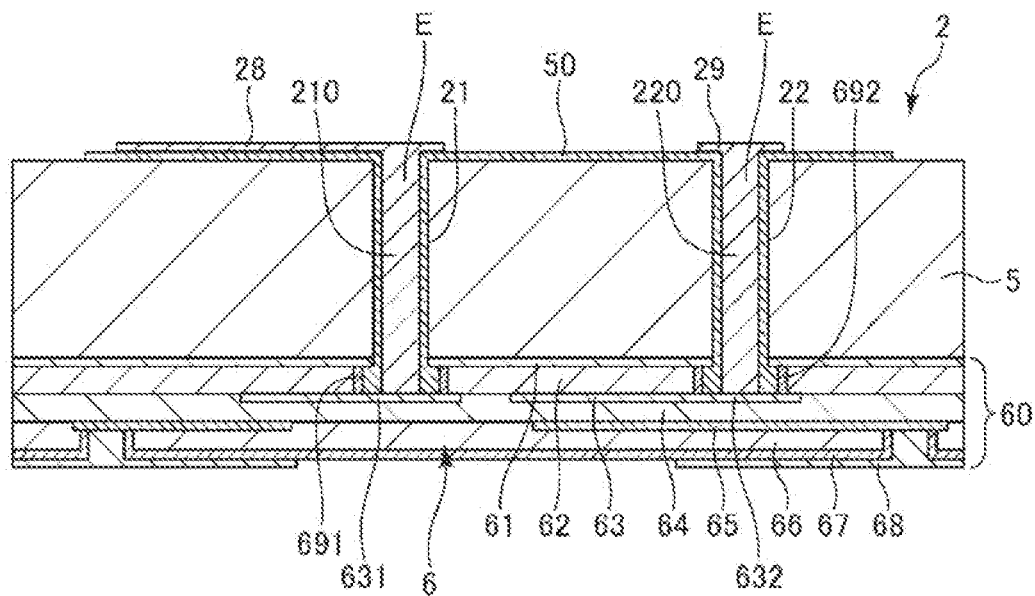
FIG. 13 is a vertical cross-sectional view illustrating the method for manufacturing the resonator device.

Next, the conductive material E is disposed in a film shape on the first surface 5a and filled in the through holes 21 and 22. Then, the conductive material E on the first surface 5a is patterned by etching. Accordingly, as illustrated in FIG. 13, the wirings 28 and 29 and the through electrodes 210 and 220 are collectively formed. The conductive material E is not particularly limited, and for example, the same material as the wiring layer 63 can be used. Accordingly, an affinity between the through electrodes 210 and 220 and the wiring layer 63 is enhanced, and contact failure or the like between the through electrodes 210 and 220 and the wiring layer 63 can be effectively prevented. Since the materials can be shared, manufacturing cost of the resonator device 1 can be reduced. However, the conductive material E is not particularly limited, and for example, a stacked structure of titanium-tungsten alloy (TiW)/copper (Cu)/gold (Au) may be used.

Resonator Component Arranging Step S3

Next, the resonator component 4 is mounted on the wirings 28 and 29 via the metal bumps 81 and 82.

Lid Arranging Step S4

Figure 14:
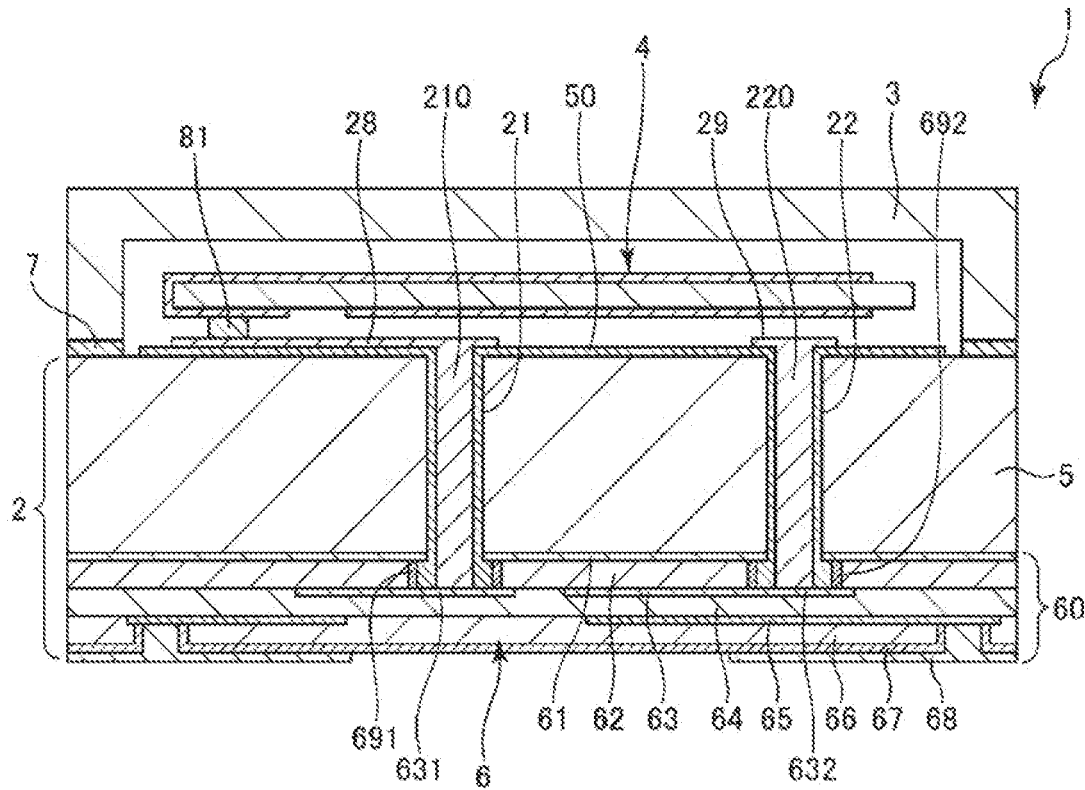
FIG. 14 is a vertical cross-sectional view illustrating the method for manufacturing the resonator device.

Next, the lid 3 is bonded to the upper surface of the base 2. Accordingly, as illustrated in FIG. 14, the resonator device 1 is manufactured.

The resonator device 1 and the method for manufacturing the resonator device 1 are described in detail above. As described above, such a resonator device 1 includes the base 2 and the resonator component 4 disposed on the base 2. The base 2 includes the semiconductor substrate 5 having the first surface 5a and the second surface 5b that are in the front-to-back relation with each other; the integrated circuit 6 that includes the wiring layer 63 disposed at the second surface 5b side and having the connection pads 631 and 632 and includes the insulating layer 62 disposed between the second surface 5b and the wiring layer 63; the through electrodes 210 and 220 that penetrate the semiconductor substrate 5 and the insulating layer 62 and are coupled to the connection pads 631 and 632; and the annular metal layers 691 and 692 that are disposed so as to penetrate the insulating layer 62 between the second surface 5b and the wiring layer 63 and surround the through electrodes 210 and 220 in the plan view of the semiconductor substrate 5. According to the resonator device 1 having such a configuration, even if the through holes 213 and 223 penetrating the insulating layer 62 are formed by the wet etching, the metal layers 691 and 692 function as the guard rings, and further side etching is restricted. Therefore, for example, the plasma damage as in the case of the dry etching is not given to the wiring layer 63, and the wiring pattern failure due to the side etching is prevented. Therefore, the resonator device 1 has a high reliability.

As described above, in the plan view of the semiconductor substrate 5, the metal layers 691 and 692 are included in the connection pads 631 and 632. As a result, the entering of the etching solution to the outside of the metal layers 691 and 692 can be more effectively prevented, and the wiring pattern failure due to the side etching can be more effectively prevented.

As described above, the integrated circuit 6 includes the plurality of wiring layers 63 and 65 stacked in the thickness direction of the semiconductor substrate 5, and the through electrodes 210 and 220 are coupled to the connection pads 631 and 632 included in the wiring layer 63, located closest to the semiconductor substrate 5 side, among the plurality of wiring layers 63 and 65. Accordingly, the through electrodes 210 and 220 can be shortened as much as possible, and the through electrodes 210 and 220 can be easily formed.

As described above, the base 2 is disposed between the second surface 5b and the insulating layer 62 and includes the etching stop layer 61 made of SiN. Accordingly, when the semiconductor substrate 5 is dry-etched to form the through holes 211 and 221, over-etching can be prevented, and the plasma damage to the wiring layer 63 can be effectively prevented.

As described above, the wiring layer 63 and the through electrodes 210 and 220 are made of the same material. Accordingly, the affinity between the through electrodes 210 and 220 and the wiring layer 63 is enhanced, and contact failure or the like between the through electrodes 210 and 220 and the wiring layer 63 can be effectively prevented.

Since the material can be shared, the manufacturing cost of the resonator device 1 can be reduced.

As described above, the resonator component 4 is disposed at the first surface 5a side of the semiconductor substrate 5. The resonator device 1 includes the lid 3 for accommodating the resonator component 4 between the lid 3 and the base 2. Accordingly, the resonator component 4 can be protected. By forming the integrated circuit 6 at the second surface 5b side, as compared with the case where the integrated circuit 6 is formed at the first surface 5a, the wide space for forming the integrated circuit 6 can be secured since no bonding region with the lid 3 exists.

As described above, the method for manufacturing the resonator device 1 includes the base preparation step S1 of preparing the base 2 that includes the semiconductor substrate 5 having the first surface 5a and the second surface 5b that are in the front-to-back relation with each other, the integrated circuit 6 that includes the wiring layer 63 disposed at the second surface 5b side and including the connection pads 631 and 632 and includes the insulating layer 62 disposed between the second surface 5b and the wiring layer 63, and the annular metal layers 691 and 692 that are disposed so as to penetrate the insulating layer 62 between the second surface 5b and the wiring layer 63; and the through electrode forming step S2 of forming the through electrodes 210 and 220 penetrating the semiconductor substrate 5 and the insulating layer 62 and coupled to the connection pads 631 and 632 through the inside of the metal layers 691 and 692. The through electrode forming step S2 includes the through hole forming step S21 of forming the through holes 21 and 22 from the first surface 5a to the connection pads 631 and 632 through the inside of the metal layers 691 and 692 by penetrating the semiconductor substrate 5 by the dry etching and then penetrating the insulating layer 62 by the wet etching, and the conductive material arranging step S22 of disposing the conductive material E in the through holes 21 and 22 to form the through electrodes 210 and 220. According to such a method, even if the through holes 213 and 223 penetrating the insulating layer 62 are formed by the wet etching, the metal layers 691 and 692 function as the guard rings, and further side etching is restricted. Therefore, for example, the plasma damage as in the case of the dry etching is not given to the wiring layer 63, and the wiring pattern failure due to the side etching is prevented. Therefore, the resonator device 1 has a high reliability.

As described above, the base 2 is disposed between the second surface 5b and the insulating layer 62 and includes the etching stop layer 61 made of SiN. Accordingly, when the semiconductor substrate 5 is dry-etched to form the through holes 211 and 221, over-etching can be prevented, and the plasma damage to the wiring layer 63 can be effectively prevented.

Second Embodiment

Figure 15:
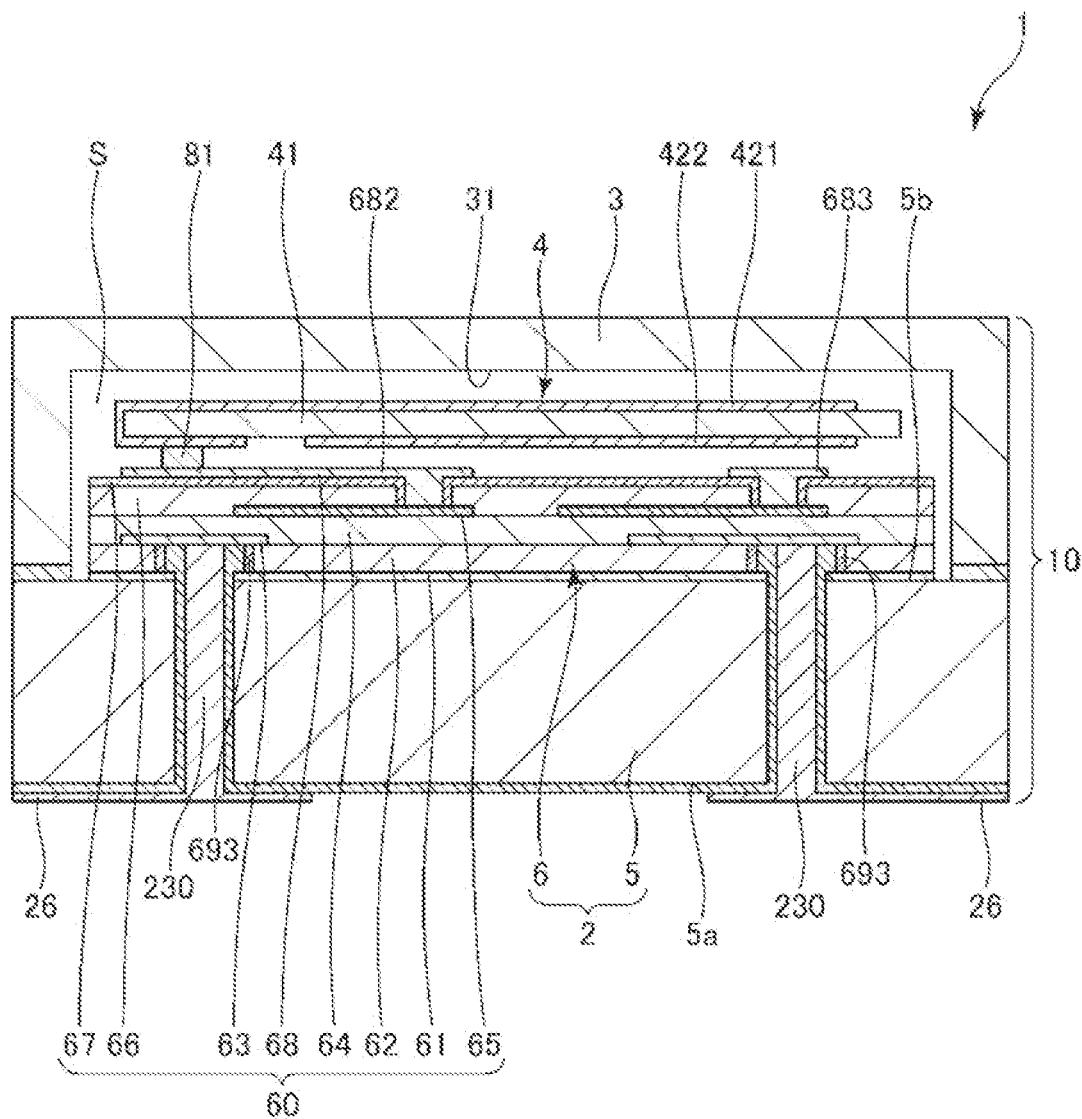
FIG. 15 is a vertical cross-sectional view illustrating a resonator device according to a second embodiment.

FIG. 15 is a vertical cross-sectional view illustrating a resonator device according to a second embodiment.

The resonator device 1 according to the present embodiment, except that the configuration of the base 2 is different, is the same as the resonator device 1 according to the first embodiment described above. In the following description, the present embodiment will be described with a focus on the difference from the above embodiment, and a description of similar matters will be omitted. In FIG. 15, the same reference numerals are given to configurations similar to those according to the above embodiment.

As illustrated in FIG. 15, the base 2 according to the present embodiment is upside down with respect to the first embodiment described above, and the integrated circuit 6 is formed at the upper surface side, that is, the second surface 5b side of the semiconductor substrate 5. The resonator component 4 is disposed at the upper surface side of the semiconductor substrate 5, and the resonator element 4 and the integrated circuit 6 are bonded via the pair of metal bumps 81 and 82. The integrated circuit 6, in order to secure a bonding space with the lid 3 on the second surface 5b of the semiconductor substrate 5, is formed to be slightly smaller than the base 2 so as to exclude an outer peripheral portion of the second surface 5b. According to such a configuration, the integrated circuit 6 can be accommodated and protected in the accommodating portion S together with the resonator component 4.

In the terminal layer 68 of the integrated circuit 6, in place of the mounting terminals 681 in the first embodiment described above, wirings 682 and 683 that electrically couple the resonator component 4 to the wiring layer 65 are disposed. At the first surface 5a side of the semiconductor substrate 5, a plurality of mounting terminals 26 are disposed in place of the wirings 28 and 29 described above. The respective mounting terminals 26 pass through an annular metal layer 693 formed through the insulating layer 62 and are electrically coupled to the integrated circuit 6 via the through electrode 230 passing through the semiconductor substrate 5, the etching stop layer 61, and the insulating layer 62. The through electrode 230 has the same configuration as the through electrodes 210 and 220 in the first embodiment described above, and the metal layer 693 has the same configuration as the metal layers 691 and 692 in the first embodiment described above. Moreover, the through electrode 230 and the metal layer 693 are formed by the same method as in the first embodiment described above.

As described above, in the resonator device 1 according to the present embodiment, the resonator component is disposed at the second surface 5b side of the semiconductor substrate 5. The resonator device 1 includes the lid 3 for accommodating the resonator component 4 and the integrated circuit 6 between the lid 3 and the base 2. Accordingly, the resonator component 4 and the integrated circuit 6 can be protected.

According to such a second embodiment, the same effect as that of the first embodiment described above can also be exerted.

Third Embodiment

Figure 16:
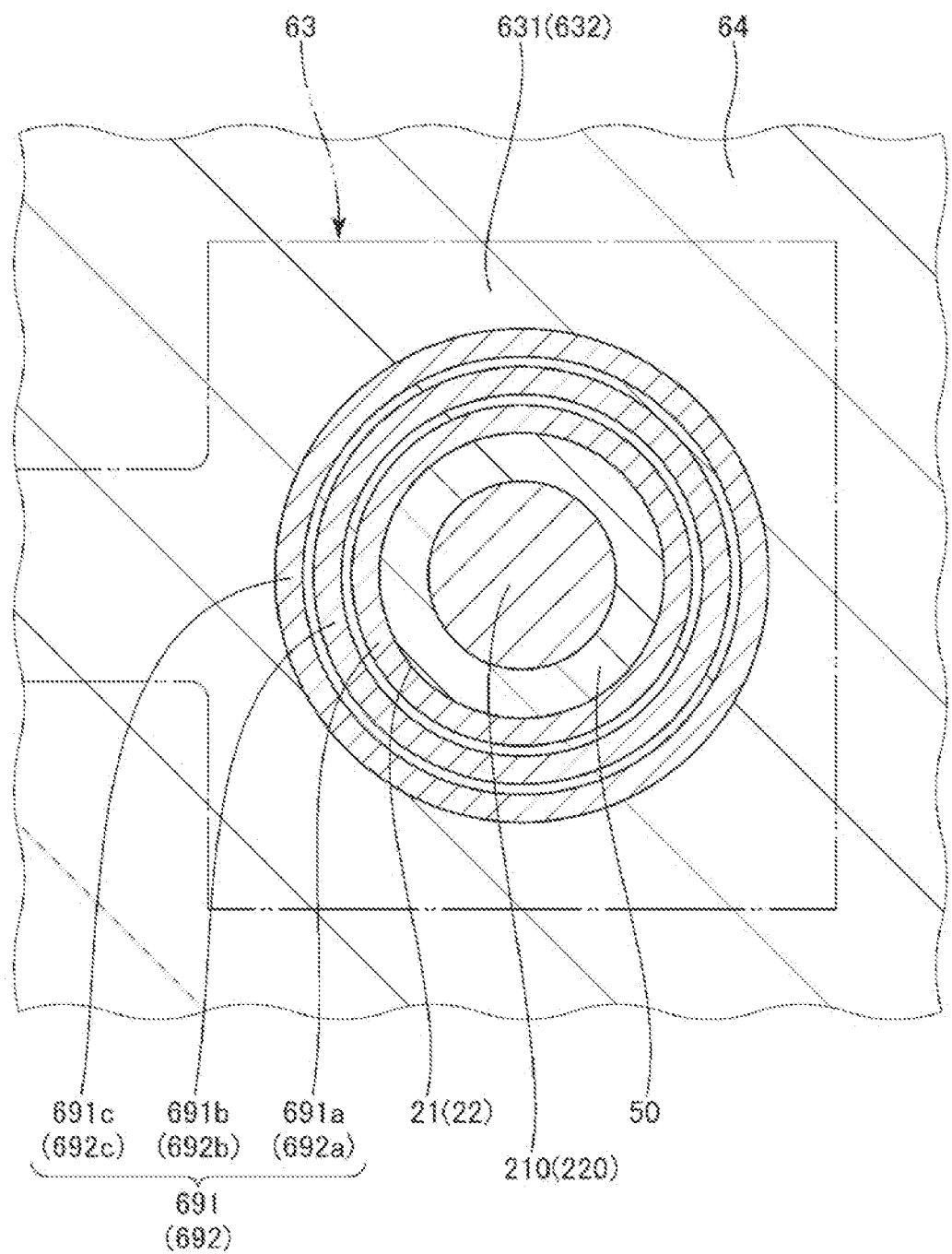
FIG. 16 is a horizontal cross-sectional view illustrating a metal layer included in a resonator device according to a third embodiment.

FIG. 16 is a horizontal cross-sectional view illustrating a metal layer included in a resonator device according to a third embodiment.

The resonator device 1 according to the present embodiment, except that the configurations of the metal layers 691 and 692 are different, is the same as the resonator device 1 according to the first embodiment described above. In the following description, the present embodiment will be described with a focus on differences from the above embodiments, and a description of similar matters will be omitted. In FIG. 16, the same reference numerals are given to configurations similar to those according to the above embodiments.

As illustrated in FIG. 16, the resonator device 1 according to the present embodiment includes a plurality of concentrically arranged metal layers 691. Specifically, the plurality of metal layers 691 include a first metal layer 691a located at an innermost position and surrounding the through electrode 210, a second metal layer 691b located outside the first metal layer 691a and surrounding the first metal layer 691a, and a third metal layer 691c located outside the second metal layer 691b and surrounding the second metal layer 691b. According to such a configuration, the triple metal layers 691 can prevent an etching solution from leaking, and thus the wiring pattern failure due to the side etching can be more reliably prevented. However, the number of the metal layers 691 is not particularly limited, and may be two or four or more.

Similarly, the resonator device 1 according to the present embodiment includes a plurality of concentrically arranged metal layers 692. Specifically, the plurality of metal layers 692 include a first metal layer 692a located at an innermost position and surrounding the through electrode 220, a second metal layer 692b located outside the first metal layer 692a and surrounding the first metal layer 692a, and a third metal layer 692c located outside the second metal layer 692b and surrounding the second metal layer 692b. According to such a configuration, the triple metal layers 692 can prevent the etching solution from leaking, and thus the wiring pattern failure due to the side etching can be more reliably prevented. However, the number of the metal layers 692 is not particularly limited, and may be two or four or more.

As described above, in the resonator device 1 according to the present embodiment, the metal layers 691 and 692 include the first metal layers 691a and 692a surrounding the through electrodes 210 and 220 and the second metal layers 691b and 692b surrounding the first metal layers 691a and 692a. Accordingly, the wiring pattern failure due to the side etching can be more reliably prevented.

According to such a third embodiment, the same effect as in the first embodiment described above can also be exerted.

Although the resonator device of the present disclosure and the method for manufacturing the resonator device are described above based on the illustrated embodiments, the present disclosure is not limited thereto, and the configuration of each unit can be replaced with an optional configuration having the same function. Further, any other constituents may be added to the present disclosure. Each of the embodiments may be combined as appropriate.

What is claimed is:

1. A resonator device, comprising:
a base; and
a resonator component disposed on the base, wherein the base includes
a semiconductor substrate having a first surface and a second surface that are in a front-to-back relation with each other,
an integrated circuit including a wiring layer that is disposed at the second surface side and includes a connection pad and an insulating layer that is disposed between the second surface and the wiring layer,
a through electrode penetrating the semiconductor substrate and the insulating layer and coupled to the connection pad, and
an annular metal layer disposed so as to penetrate the insulating layer between the second surface and the wiring layer, and surrounding the through electrode in a plan view of the semiconductor substrate, and the base is disposed between the second surface and the insulating layer and includes an etching stop layer made of SiN.

2. The resonator device according to claim 1, wherein the annular metal layer is formed within the limits of the connection pad in an overhead plan view of the semiconductor substrate.

3. The resonator device according to claim 1, wherein the integrated circuit includes a plurality of wiring layers stacked in a thickness direction of the semiconductor substrate, and
the through electrode is coupled to the connection pad included in the wiring layer that is located closest to the semiconductor substrate side among the plurality of wiring layers.

4. The resonator device according to claim 1, wherein the annular metal layer includes a first metal layer surrounding the through electrode and a second metal layer surrounding the first metal layer.

5. The resonator device according to claim 1, wherein the wiring layer and the through electrode are made of the same material.

6. The resonator device according to claim 1, wherein the resonator component is disposed at the first surface side of the semiconductor substrate, and
a lid for accommodating the resonator component between the lid and the base is included.

7. The resonator device according to claim 1, wherein the resonator component is disposed at the second surface side of the semiconductor substrate, and
a lid for accommodating the resonator component and the integrated circuit between the lid and the base is included.

8. A method for manufacturing a resonator device, comprising:
a base preparation step of preparing a base that includes a semiconductor substrate that has a first surface and a second surface being in a front-to-back relation with each other, an integrated circuit that includes a wiring layer disposed on the second surface side and having a connection pad and includes an insulating layer disposed between the second surface and the wiring layer, and an annular metal layer that is disposed so as to penetrate the insulating layer between the second surface and the wiring layer wherein the base is disposed between the second surface and the insulating layer and includes an etching stop layer made of SiN; and
a through electrode forming step of forming a through electrode that penetrates the semiconductor substrate and the insulating layer, passes through an inside of the metal layer, and is coupled to the connection pad, wherein
the through electrode forming step includes
a through hole forming step of forming a through hole from the first surface to the connection pad through the inside of the metal layer by penetrating the semiconductor substrate by dry etching and then penetrating the insulating layer by wet etching, and
a conductive material arranging step of disposing a conductive material in the through hole to form the through electrode.

* * * * *